US006930915B2

(12) United States Patent
Lammers et al.

(10) Patent No.: US 6,930,915 B2
(45) Date of Patent: Aug. 16, 2005

(54) CROSS-POINT MRAM ARRAY WITH REDUCED VOLTAGE DROP ACROSS MTJ'S

(75) Inventors: Stefan Lammers, South Burlington, VT (US); Hans-Heinrich Viehmann, South Burlington, VT (US); John Kenneth DeBrosse, Colchester, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/465,003

(22) Filed: Jun. 19, 2003

(65) Prior Publication Data

US 2004/0257869 A1 Dec. 23, 2004

(51) Int. Cl.[7] ............................................. G11C 11/14
(52) U.S. Cl. .......................................... 365/171; 365/158
(58) Field of Search ................................. 365/171, 158

(56) References Cited

U.S. PATENT DOCUMENTS

| | | | | |
|---|---|---|---|---|
| 6,052,302 A | * | 4/2000 | Moyer et al. | 365/173 |
| 6,747,891 B2 | * | 6/2004 | Hoffmann et al. | 365/158 |
| 2002/0003720 A1 | | 1/2002 | Bohm et al. | |
| 2002/0021643 A1 | | 2/2002 | Gogi et al. | |
| 2002/0024875 A1 | | 2/2002 | Bohm et al. | |

* cited by examiner

*Primary Examiner*—Van Thu Nguyen
*Assistant Examiner*—Pho M. Luu
(74) *Attorney, Agent, or Firm*—Slater & Matsil, L.L.P.

(57) ABSTRACT

A method of storing information in a cross-point magnetic memory array and a cross-point magnetic memory device structure. The voltage drop across magnetic tunnel junctions (MTJ's) during a write operation is minimized to prevent damage to the MTJ's of the array. The voltage drop across the selected MTJ's, the unselected MTJ's, or both, is minimized during a write operation, reducing stress across the MTJ's, decreasing leakage currents, decreasing power consumption and increasing the write margin.

51 Claims, 4 Drawing Sheets

CROSS-POINT MRAM ARRAY WITH REDUCED VOLTAGE DROP ACROSS MTJ'S

TECHNICAL FIELD

The present invention relates generally to the fabrication of semiconductor devices, and more particularly to the fabrication of magnetic random access memory (MRAM) devices.

BACKGROUND

A more recent development in semiconductor memory devices involves spin electronics, which combines semiconductor technology and magnetics. The spin of an electron, rather than the charge, is used to indicate the presence of a "1" or "0". One such spin electronic device is a magnetic random access memory (MRAM), which includes conductive lines positioned in a different direction, e.g., perpendicular to one another in different metal layers, the conductive lines sandwiching a magnetic stack or magnetic tunnel junction (MJT), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic memory cell depends on the moment's alignment. The stored state is read from the magnetic memory cell by detecting the component's resistive state.

An advantage of MRAMs compared to traditional semiconductor memory devices such as dynamic random access memory devices (DRAMs) is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data. Therefore, MRAM devices are replacing flash memory, DRAM and static random access memory devices (SRAM) devices in electronic applications where a memory device is needed.

A magnetic stack comprises many different layers of metals and magnetic metals, and a thin layer of dielectric material having a total thickness of a few tens of nanometers. The magnetic stacks are typically built on top of copper wires embedded in an inter-level dielectric (ILD) material. The magnetic tunnel junctions (MTJ's) are positioned at intersections of underlying first conductive lines and overlying second conductive lines. MRAM devices are typically manufactured by forming a plurality of magnetic metal stacks arranged in an array, which comprise the magnetic memory cells. A memory cell array typically has conductive lines in a matrix structure having rows and columns.

One type of MRAM array uses a transistor to select each magnetic memory cell. Another type, a cross-point array, comprises an array of magnetic bits or magnetic stacks situated at the cross-points between two conductive lines. Information is stored in one of the magnetic layers of the magnetic stacks. To store the information, a magnetic field is necessary. In a cross-point array, this magnetic field is provided by a word line and bit line current which is passed through conductive lines. Information is stored in the magnetic memory cells by aligning the magnetization of one ferromagnetic layer (the information layer or free layer) either parallel or antiparallel to a second magnetic layer (the reference layer or fixed layer). The information is detectable due to the fact that the resistance of the element in the parallel case is different from the antiparallel case. Magnetic stacks or memory cells in a cross-point array are written by passing currents through the conductive lines, e.g., in both the x- and y-direction, and where the conductive lines cross at the cross-points, the combined magnetic field is large enough to change the magnetic orientation.

A problem in cross-point MRAM arrays is that if a voltage potential is applied across a selected MJT (e.g., the MTJ being written to) during a write operation, this can create stress on the MTJ and possibly destroy the MTJ. The dielectric layer of the MTJ is thin and delicate and may be destroyed if a voltage is applied across the MTJ. Furthermore, if a voltage potential is applied across unselected MTJ's during a write operation, this can cause leakage current through the unselected MTJ, which increases power consumption.

Leakage current is particularly a problem for MTJ's along a conductive line being written. If there is leakage current through unselected MTJ's on a conductive line being written, this consumes some of the write current, causing different magnetic fields to be generated from the write current for each MTJ along a particular conductive line. Generating different magnetic fields decreases the write margin.

Therefore, what is needed in the art is a cross-point MRAM array design with a reduced voltage drop across the MTJ's.

SUMMARY OF THE INVENTION

Embodiments of the present invention solve these problems by ensuring that the MTJ's have a minimized voltage drop across the MTJ's, for both selected cells and non-selected cells, during a write operation. The direction of the write current for a word line and bit line of a selected MTJ is chosen according to the physical location of the selected MTJ in the array, to reduce the voltage drop across the selected MTJ. In one embodiment, the word lines of non-selected MTJ's are coupled to a mid-point voltage of the selected MTJ bit lines, and the bit lines of non-selected MTJ's are coupled to a mid-point voltage of the selected MTJ word lines, during the write operation of selected MTJ'S. In another embodiment, a resistance is added to each bit line or word line of non-selected MTJ's, to eliminate the voltage drop across the non-selected MTJ's.

In accordance with a preferred embodiment of the present invention, a method of storing information to a magnetic memory device includes providing a cross-point magnetic memory cell array, the array including a plurality of first conductive lines running parallel to one another in a first direction, a plurality of second conductive lines running parallel to one another in a second direction, the second direction being different from the first direction, and a plurality of MTJ's disposed between the first conductive lines and the second conductive lines at the intersections of the first conductive lines and the second conductive lines. The method includes selecting at least one MTJ to store information in, wherein the other MTJ's are unselected, and storing information in the selected at least one MTJ by running a first current through the first conductive line of the selected at least one MTJ while running a second current through the second conductive line of the selected at least one MTJ and while minimizing a voltage drop across at least one of the MTJ's.

In accordance with another preferred embodiment of the present invention, a cross-point magnetic memory device includes a cross-point magnetic memory cell array, the array including a plurality of first conductive lines running parallel to one another in a first direction, a plurality of second conductive lines running parallel to one another in a second direction, the second direction being different from the first direction, a plurality of MTJ's disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's.

In accordance with yet another preferred embodiment of the present invention, a method of minimizing a voltage drop across at least one selected MTJ during a write operation in a cross-point magnetic memory cell array including a plurality of first conductive lines running parallel to one another in a first direction, a plurality of second conductive lines running parallel to one another in a second direction, the second direction being different from the first direction, and a plurality of MTJ's being disposed between the first conductive lines and the second conductive lines at the intersections of the first conductive lines and the second conductive lines, a current source/drain (CSD) being coupled to an end of each first conductive line and each second conductive line, each CSD being adapted to function as a current source or a current drain. The method includes storing information in the selected at least one MTJ by running a first current from a CSD at a first end of the first conductive line to a CSD at a second end of the first conductive line of the selected at least one MTJ while running a second current from a CSD at a first end of the second conductive line to a CSD at a second end of the second conductive line of the selected at least one MTJ, wherein the direction of the first current and second current is selected as a function of the physical location of the at least one selected MTJ in the array to minimize the voltage drop of the at least one selected MTJ.

In accordance with another preferred embodiment of the present invention, a method of minimizing a voltage drop across unselected MTJ's during a write operation of at least one selected MTJ in a cross-point magnetic memory cell array including a plurality of first conductive lines running parallel to one another in a first direction, a plurality of second conductive lines running parallel to one another in a second direction, the second direction being different from the first direction, and a plurality of MTJ's being disposed between the first conductive lines and the second conductive lines at the intersections of the first conductive lines and the second conductive lines, a CSD being coupled to an end of each first conductive line and each second conductive line, each CSD being adapted to function as a current source or a current drain, the cross-point memory cell array having a top edge, a bottom edge, a left edge and a right edge. The method includes storing information in the selected at least one MTJ by running a first current from a CSD at a first end of the first conductive line to a CSD at a second end of the first conductive line of the selected at least one MTJ while running a second current from a CSD at a first end of the second conductive line to a CSD at a second end of the second conductive line of the selected at least one MTJ, wherein the voltage drop across the unselected magnetic tunnel junctions is minimized by clamping the first conductive lines or second conductive lines of the unselected MTJ's to a mid-point voltage.

Advantages of minimizing the voltage drop of selected MTJ's in accordance with embodiments of the present invention include achieving a decreased maximum voltage across the selected MTJ during the write operation. Because the voltage drop is reduced or minimized, less damage to MTJ's results. The full range, e.g., all quadrants, of the asteroid curve of the MTJ cell is advantageously utilized in a novel way, by changing the direction of the current on both the bit lines and word lines in a write operation.

Advantages of minimizing the voltage drop of non-selected MTJ's include decreasing the leakage current through the selected MTJ's during the write operation. The write margin is increased due to minimized leakage current along the selected word line and bit line. Adding resistance to the edge of the word lines or bit lines results in all unselected MTJ's being clamped to the same voltage, which means that there is no stress on the MTJ's and no parasitic currents through the unselected MTJ's, decreasing power consumption and increasing write margin.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a MRAM device. Embodiments of the present invention may also be applied, however, to other magnetic memory cell designs and magnetic semiconductor device applications. Only one magnetic memory cell is shown in some of the figures; however, there may be many other magnetic memory cells, word lines, bit lines, and other devices and elements manufactured in the material layers shown.

Figure 1A:
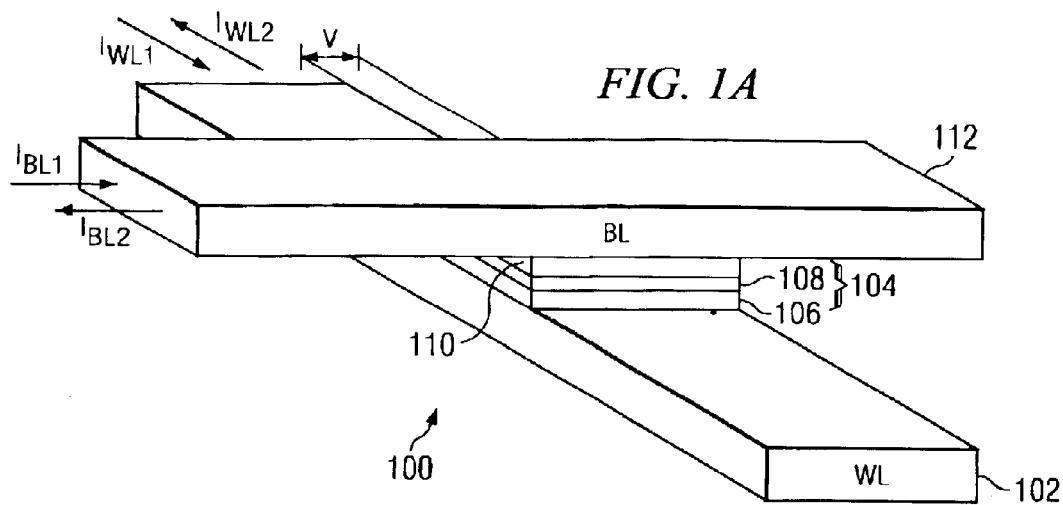
FIG. 1A shows a perspective view of an MRAM memory cell in a cross-point array.

FIG. 1A shows a perspective view of a portion of a prior art cross-point MRAM array 100. The MRAM device 100 includes a semiconductor wafer comprising a workpiece (not shown). The workpiece has a first insulating layer (also not shown) deposited thereon, and a plurality of first conductive lines 102 is formed within the first insulating layer. The first conductive lines 102 may comprise copper, aluminum, combinations thereof, and/or other metals, for example. The first conductive lines 102 are also referred to herein as word lines (WL), although the first conductive lines 102 may alternatively comprise bit lines, for example.

In a cross-point magnetic memory device 100, each memory cell or magnetic tunnel junction (MTJ) 104 is disposed over and abuts one first conductive line 102, as shown. The MTJ 104 of a magnetoresistive memory comprises three different layers 106, 108 and 110. The MTJ 104 includes a first magnetic layer 106 disposed over and abutting the first conductive line 102. The first magnetic layer (ML) 106 is often referred to as a fixed layer 106 because the magnetic orientation is fixed. A tunnel layer (TL) or tunnel barrier 108 comprising a thin dielectric layer is formed over the fixed layer 106. A second magnetic layer 110 is formed over the tunnel layer 108. The second magnetic layer 110 is often referred to as a free layer 110 because the magnetic orientation can be switched in one of two directions depending on the logic state of the memory cell.

Each MTJ 104 has a second conductive line 112 disposed over and abutting the second magnetic layer 110, as shown in FIG. 1A, wherein the second conductive line 112 is positioned in a direction different from the direction of the first conductive line 102, e.g., the second conductive line 112 may be orthogonal to the first conductive line 102. The second conductive lines 112 are also referred to herein as bit lines (BL), although the second conductive lines 112 may alternatively comprise word lines (WL), for example.

An array 100 of magnetic memory cells 104 comprises a plurality of first conductive lines 102 (not shown in FIG. 1A: see FIGS. 3 and 5) running parallel to one another in a first direction, a plurality of second conductive lines 112 running parallel to one another in a second direction, the second direction being different from the first direction, and a plurality of MTJ's 104 disposed between the first conductive lines 102 and the second conductive lines 112 at the intersections or cross-points of the first conductive lines 102 and the second conductive lines 112.

Figure 1B:
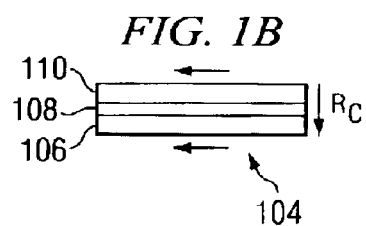
FIG. 1B shows a cross-sectional view of a MRAM memory cell in a low resistance state.
Figure 1C:
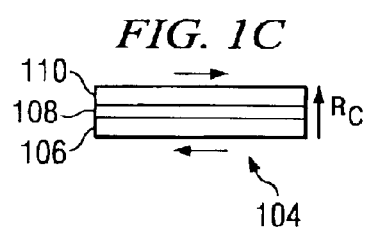
FIG. 1C shows a cross-sectional view of a MRAM memory cell in a high resistance state.

Referring again to FIG. 1A, either one of the first or second magnetic layers 106 and 110 may comprise a hard magnetic material (and is the fixed layer) the other comprises a soft magnetic material (and is the free layer), although in the discussion herein, the first magnetic layer 106 comprises the hard magnetic material, and the second magnetic layer 110 comprises the soft magnetic material. The value of the resistance through the cell or MTJ 104 depends on the way in which the magnetic dipoles of the soft magnetic layer 110 are oriented to the dipoles of the hard magnetic layer 106. If the first and second magnetic layers 106 and 110 are oriented in the same direction, and shown in FIG. 1B, the cell resistance $R_c$ is low. If the first and second magnetic layers 106 and 110 are oriented in opposite directions, as shown in FIG. 1C, the cell resistance $R_c$ is high. These two states of the cell are used to store digital information (a logic "1" or "0", high or low resistance, or vice versa).

The hard magnetic layer 106 is oriented once during manufacturing. The information of the cell 104 is stored in the soft magnetic layer 110. The currents through the word line 102 and bit line 112 provide the magnetic field that is necessary to store information in the soft magnetic layer 110. The superimposed magnetic field of the bit line 112 and word line 102 current has the ability to switch the magnetic dipoles in the soft magnetic layer 110 and change the logic state of the cell 104.

Figure 2:
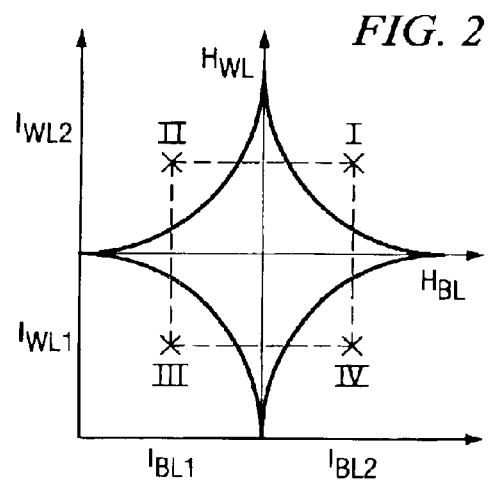
FIG. 2 shows an asteroid curve representing switching characteristics of an MRAM memory cell.

MRAM cells 104 have a switching characteristic in the shape of an asteroid curve, as shown in FIG. 2. The asteroid is defined by Eq. 1:

$$H_{WL}^{2/3} + H_{BL}^{2/3} = H_K^{2/3}, \qquad \text{Eq. 1}$$

where $H_K$ is the coercivity, and $H_{WL}$ and $H_{BL}$ are the magnetic fields generated by the currents of the word line 102 and bit line 112. To switch the soft magnetic layer 110 of the cell 104, the superposition of the bit line 112 and word line 102 field has to be large enough to go outside the asteroid, e.g., to the x in each quadrant I, II, III, IV shown. In the soft magnetic layer 110, one of these fields, referred to as the easy axis field, which in this example is $H_{BL}$ along the horizontal axis in FIG. 2, is oriented parallel to the switching axis. The other field, called the hard axis field, is oriented orthogonal to the switching axis, which in this example is $H_{WL}$ along the y axis.

In the discussion herein, it is assumed that the bit line 112 current $I_{BL1}$ or $I_{BL2}$ generates the easy axis field $H_{BL}$, which is the data dependent field, and the word line 102 current $I_{WL1}$ or $I_{WL2}$ generates the hard axis field $H_{WL}$, although alternatively, a cross-point magnetic memory array may be oriented with either the first conductive lines 102 or second conductive lines 112 generating the easy or hard axis fields. It is further assumed herein that the hard magnetic layer 106 is oriented in such a way that a bit line current $I_{BL2}$ running from left to right generates a magnetic field, which polarizes the magnetic dipoles in the soft magnetic layer 110 of the cells 104 in the same direction as the magnetic dipoles of the hard magnetic layer 106, programming or writing a logic '0' or a low resistive cell. Likewise, a bit line current $I_{BL1}$ running from right to left results in programming or writing a logic '1' or a high resistive cell.

During a write operation, a first current is passed through a selected word line 102 and a second current is passed through a selected bit line 104 for a particular MTJ 104.

These currents generate a voltage drop along the word line 102 and bit line 112. This voltage drop can be calculated by multiplying the write current and the resistance of the line 102 or 112. The word lines 102 and bit lines 112 that are not selected can be clamped to a defined voltage in an attempt to reduce the cell stress, or voltage drop V across the cell 104 (see FIG. 1A). However, there is a voltage gradient along the word line 102 and bit line 112 for selected cells during a write operation due to the resistance of the conductive material of the word line 102 and bit line 112. For example, there is a higher potential on the word lines 102 and bit lines 112 that are physically located closer to the current sources than the current drains (or current sinks) during a write operation, because the voltage drop along the word line or bit line is higher. Similarly, there is a lower potential on the word lines 102 and bit lines 112 that are physically located farther from the current sources than the current drains (or current sinks) during a write operation, because the voltage drop along the word line 102 or bit line 112 is lower.

During a write operation of the prior art, only the direction of a bit line current is changed to write a '1' or '0' to a cell: the current for a word line is always passed through in the same direction. Thus, in the prior art, only the top half ($I_{WL2}$) or the lower half ($I_{BL2}$) of the asteroid curve is used when writing to magnetic memory cells. This is problematic, because a high voltage potential is created across cells that are physically located far away from a word line current source, but close to a bit line current source. Similarly, a high voltage potential is created across cells that are located close to a word line current source but are located far away from a bit line current source. Depending on the write current and the resistance of the line, a voltage potential across a cell being written to could result in the destruction of the cell.

In a preferred embodiment of the present invention, this cell stress or voltage potential is minimized or eliminated by selecting the direction of the word line current $I_{WL1}$ and $I_{WL2}$ as shown in FIG. 1A depending on the location of the selected cell 104 in an array, and also depending on the information that needs to be written in the cell 104. In this cell location depending write concept, the stress of the selected cells 104 during a write operation is reduced. Both the direction of the bit line 112 current $I_{BL1}$ and $I_{BL2}$ and word line 102 write current $I_{WL1}$ and $I_{WL2}$ are changed according to the physical location of the cell 104 in the array 100, in order to switch the information, or change the orientation of magnetic dipoles in soft magnetic layer 110 of the cell 104. In this manner, the information is essentially written in quadrants I and III, or alternatively in quadrants II and IV of the asteroid (see FIG. 2), depending on the location of the selected cell. Thus, advantageously, embodiments of the present invention utilize the entire asteroid when writing to a magnetic memory cell 104.

Figure 3:
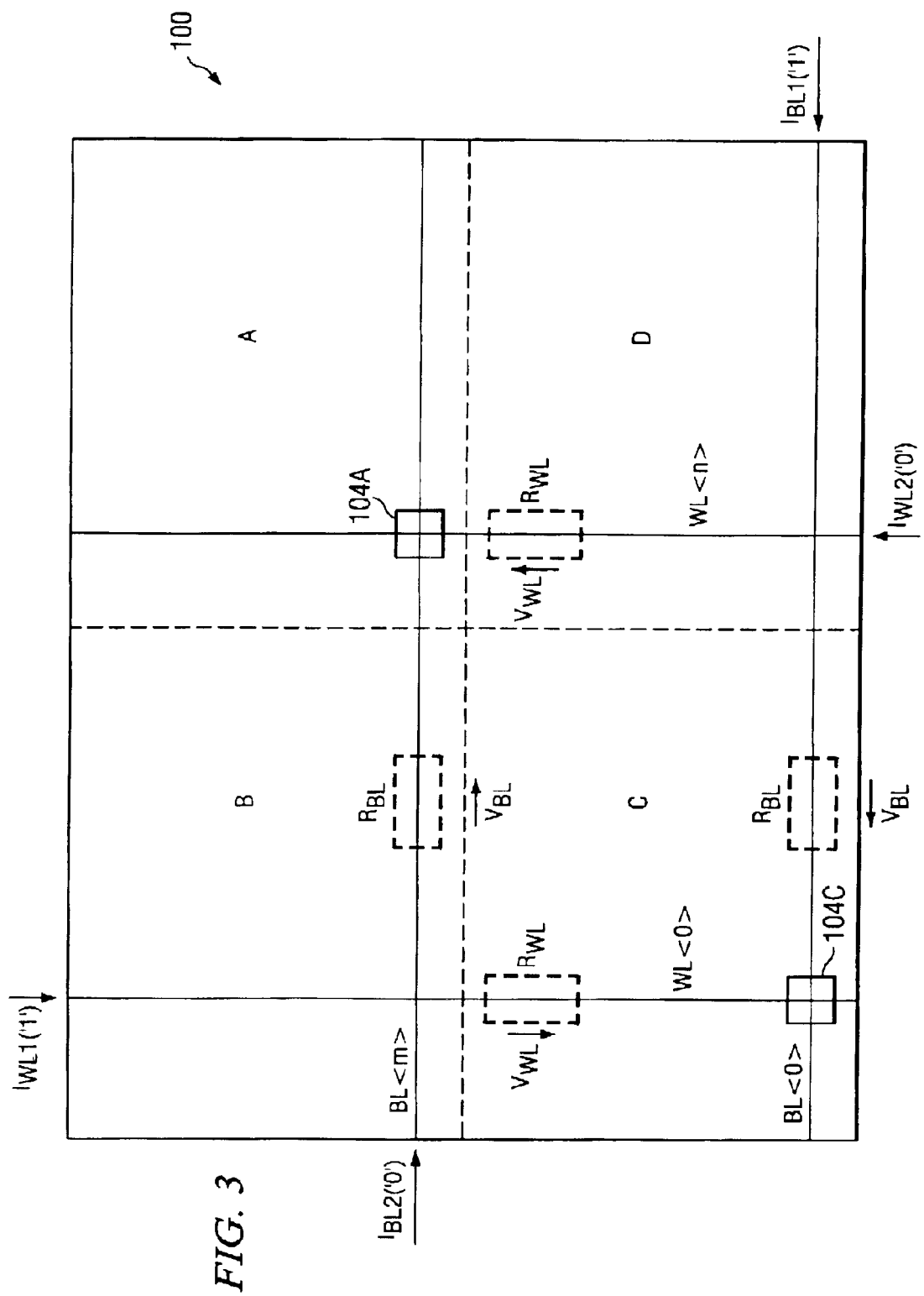
FIG. 3 shows an MRAM array having four quadrants in accordance with an embodiment of the present invention, wherein the directions of the word line and bit line currents are chosen depending on the position of each MRAM cell in the array in order to minimize the voltage drop across the selected MRAM cell.

The concept is illustrated in the array 100 of FIG. 3. The memory array 100 is divided into four quadrants A, B, C, and D. Magnetic memory cell 104A comprising an MTJ resides in quadrant A of the array 100. To write a digital or logic "0" to cell 104A, in accordance with an embodiment of the invention, a current $I_{WL2}$ is passed from the bottom edge of the array 100 to the top edge along word line WL<n>, as shown. Simultaneously, a current $I_{BL2}$ is passed from the left edge of the array 100 to the right edge along bit line BL<m>. The direction of the currents $I_{WL2}$ and $I_{BL2}$ are selected depending on the location of the cell 104A in the array, in order to minimize the voltage across the memory cell 104A.

For purposes of discussion regarding FIG. 3, it is assumed that the word line current and bit line current are equal, and also that resistances $R_{BL}$ and $R_{WL}$ are equal. Because cell 104A is in quadrant A, the resistance $R_{BL}$ and thus the voltage $V_{BL}$ are substantially the same to the left of the cell 104A as the resistance $R_{WL}$ and voltage $V_{WL}$ to the bottom of the cell 104A. Thus, the voltage drop across the memory cell 104A from the current running through the bit line BL<m> and the word line WL<n> is minimized. Because the cell 104A is physically located distant from a current source (not shown in FIG. 3: see FIG. 4) at the left edge of the array 100, and is also physically located distant from a current source at the bottom edge of the array 100, a low voltage is placed at both the first magnetic layer 106 and the second magnetic layer 110 of the cell 104A, minimizing the voltage drop V (see FIG. 1A0 across the cell 104A.

However, to write a digital or logic "1" to magnetic memory cell 104C, the direction of both the bit line current and the word line current is reversed, in accordance with an embodiment of the present invention. A current $I_{WL1}$ is passed from the top edge of the array 100 to the bottom edge along word line WL<0>, while a current $I_{BL1}$ is passed from the right edge of the array 100 to the left edge along bit line BL<0>. The directions of the currents $I_{WL1}$ and $I_{BL1}$ are selected depending on the location of the cell 104C in the array, in order to minimize the voltage drop V across the memory cell 104C.

In this example, because cell 104C is in quadrant C, the bit line resistance $R_{BL}$ and thus the bit line voltage $V_{BL}$ are substantially the same to the right of the cell 104A as the word line resistance $R_{WL}$ and word line voltage $V_{WL}$ to the top of the cell 104A. Thus, the voltage drop across the memory cell 104C from the current running through the bit line BL<0> and the word line WL<0> is minimized. Because the cell 104C is physically located distant from a current source (not shown in FIG. 3: see FIG. 4) at the right edge of the array 100, and is also physically located distant from a current source at the top edge of the array 100, a low voltage is placed at both the first magnetic layer 106 and the second magnetic layer 110 (see FIG. 1A) of the cell 104A, minimizing the voltage drop V across the cell 104A.

In a similar manner, in accordance with embodiments of the present invention, the bit line and word line current directions are selected when writing to selected magnetic memory cells 104 by writing to a cell 104 that is physically located in close proximity to a current source at a right edge, and also physically located in close proximity to a current source at a bottom edge of the array 100, resulting in a reduced voltage drop across the magnetic memory cell 104. The direction of bit line and word line current for cells 104 in each quadrant of the array are selected so that the current emits from a source either close to the cell on both edges, or emits from a source distant from the cell on both edges, in order to minimize the voltage drop across the selected magnetic memory cells 104 during the write operation.

Figure 4:
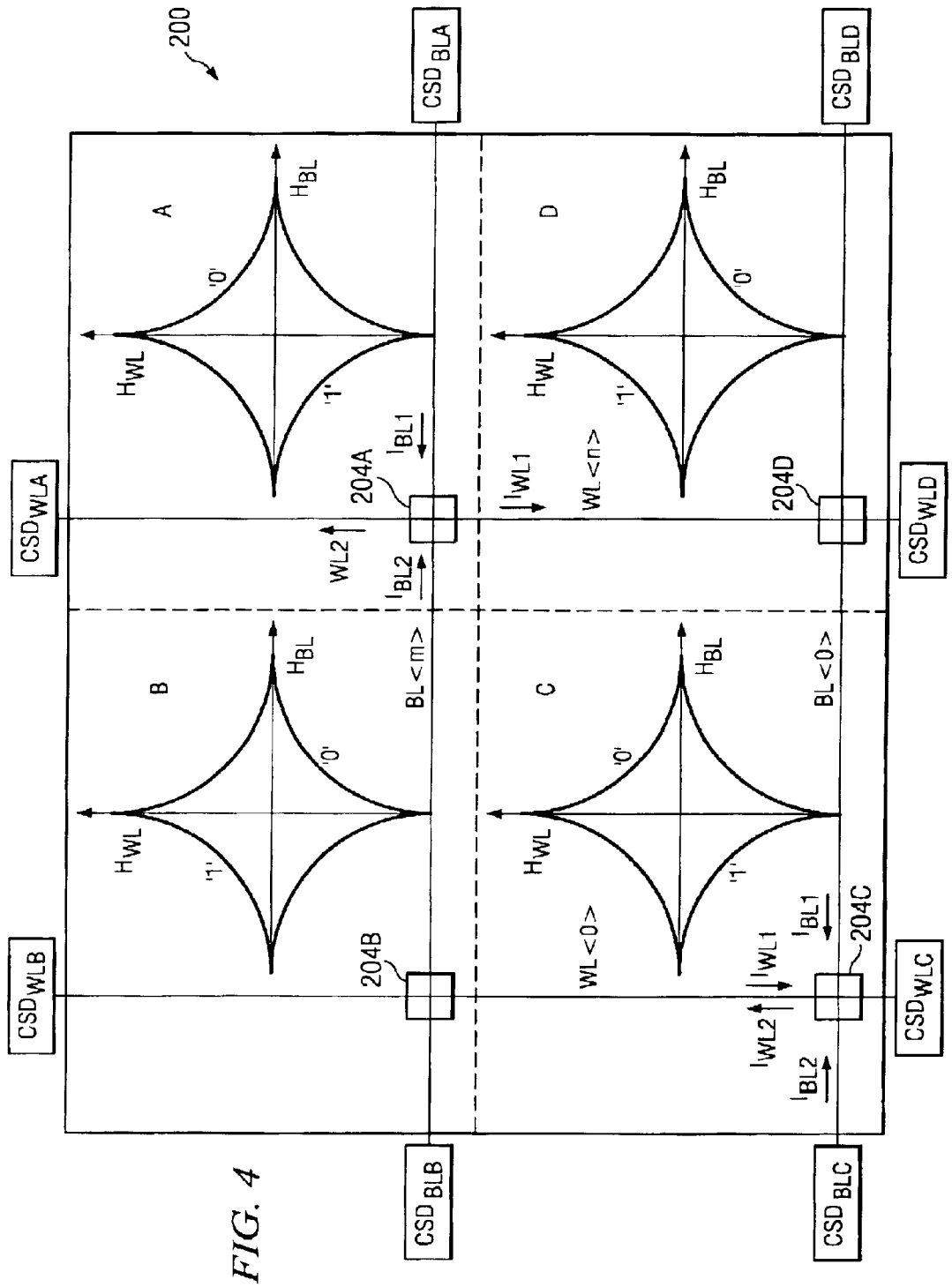
FIG. 4 shows the asteroid curves and word line and bit line currents used in each quadrant of the MRAM array in accordance with a preferred embodiment of the present invention, and which two quadrants of the asteroid are used for writing a "1" or "0" in cells depending on their physical location in the array.

FIG. 4 illustrates the asteroid curves and word line and bit line currents used in each quadrant of an MRAM array 200 in accordance with a preferred embodiment of the present invention. The direction the word line and bit line currents $I_{WL1}$, $I_{WL2}$, $I_{BL1}$ and $I_{BL2}$ preferably run is shown, depending on the location of the selected cell in the array (or subarray). In particular, FIG. 4 shows which two quadrants of the asteroid are used to write a '1' and a '0', depending on the location of the selected cell 204A, 204B, 204C or 204D. In this discussion, it is assumed that writing in the top half of the asteroid means the word line write current $I_{WL2}$ direction is from bottom to top, for example.

The memory array 200 is divided into 4 quadrants A, B, C and D. To write a '1' in the MTJ 204D in quadrant D, the word line current $I_{WL2}$ is used that is run from a current source/drain ($CSD_{WLD}$) at the bottom edge of the array 200 to a current source/drain ($CSD_{WLB}$) at the top edge of the array 200. To write a '0' to MTJ 204D in quadrant D, the word line current direction needs to be changed to reduce the voltage drop across the selected cell. Thus, a word line current $I_{WL1}$ is used that is run from a current source/drain ($CSD_{WLB}$) at the top edge of the array 200 to a current source/drain ($CSD_{WLD}$) at the bottom edge of the array 200.

To write to more than one cell along the word line simultaneously, two separate write operations are required. The '1' information and the '0' information needs to be written separately, because both the word line current direction and the bit line current direction needs to be changed in order to minimize the voltage drop across selected MTJ's 204A and 204B, for example.

Two different write approaches for writing more than one cell along the word line are possible. If all selected cells are located in the same quadrant of the array, the '1' information has to be written separately from the '0' information. If the selected cells are located in different quadrants for example B and C the '1' information in quadrant B could be written simultaneously with the '0' information in quadrant C and vise versa. That way only two separate write operations are required.

Thus, in accordance with an embodiment of the present invention, a cross-point magnetic memory cell array 200 includes a plurality of first conductive lines WL<0> and WL<n> running parallel to one another in a first direction, a plurality of second conductive lines BL<0> and BL<m> running parallel to one another in a second direction, the second direction being different from the first direction, and a plurality of MTJ's 204A, 204B, 204C or 204D being disposed between the first conductive lines WL<0> and WL<n> and the second conductive lines BL<0> and BL<m> at the intersections of the first conductive lines WL<0> and WL<n> and the second conductive lines BL<0> and BL<m>. A current source/drain $CSD_{WLA}$, $CSD_{WLB}$, $CSD_{WLC}$, $CSD_{WLD}$ (CSD) $CSD_{BLA}$, $CSD_{BLB}$, $CSD_{BLC}$ or $CSD_{BLD}$ is coupled to an end of each first conductive line WL<0> and WL<n> and each second conductive line BL<0> and BL<m>. Each CSD is adapted to function as a current source or a current drain.

In accordance with one embodiment, a method of minimizing a voltage drop V (see FIG. 1A) across at least one selected MTJ 204A, 204B, 204C or 204D (FIG. 4) of a cross-point magnetic memory cell array 200 during a write operation includes storing information in the selected at least one MTJ 204A, 204B, 204C or 204D by running a first current $I_{WL1}$ or $I_{WL2}$ from a current source/drain $CSD_{WLA}$, $CSD_{WLB}$, $CSD_{WLC}$ or $CSD_{WLD}$ at a first end of the first conductive line WL<0> or WL<n> to a current source/drain $CSD_{WLA}$, $CSD_{WLB}$, $CSD_{WLC}$ or $CSD_{WLD}$ at a second end of the first conductive line WL<0> or WL<n> of the selected at least one MTJ 204A, 204B, 204C or 204D, while simultaneously running a second current $I_{BL1}$ or $I_{BL2}$ from a current source/drain $CSD_{BLA}$, $CSD_{BLB}$, $CSD_{BLC}$ or $CSD_{BLD}$ at a first end of the second conductive line BL<0> or BL<m> to a current source/drain $CSD_{BLA}$, $CSD_{BLB}$, $CSD_{BLC}$ or $CSD_{BLD}$ at a second end of the second conductive line BL<0> or BL<m> of the selected at least one MTJ 204A, 204B, 204C or 204D. The direction of the first current $I_{WL1}$ or $I_{WL2}$ and second current $I_{BL1}$ or $I_{BL2}$ is selected as a function of the physical location of the at least one selected MTJ 204A, 204B, 204C or 204D in the array, e.g., which quadrant A, B, C, or D the MTJ is located in, in order to minimize the voltage drop V (FIG. 1A) of the at least one selected MTJ 204A, 204B, 204C or 204D.

Another embodiment of the present invention includes a cross-point magnetic memory device 100/200 in which the voltage drop V (of FIG. 1A) is minimized across selected MTJ's 104/204, as described herein. The cross-point magnetic memory device 100/200 comprises an MRAM array in a preferred embodiment.

In yet another embodiment of the present invention, the voltage drop across unselected magnetic memory cells, rather than selected magnetic memory cells as in previous embodiments described herein, is minimized by clamping the unselected cell word lines and bit lines to a mid-point voltage. Preferably, the clamping mid-point voltages for the bit lines and word lines comprise a middle potential voltage of selected word lines and bit lines, respectively, to be described further herein. In one embodiment, a difference in middle potential voltages for word lines and bit lines during write operations can be accommodated for, to further reduce the voltage drop across unselected magnetic memory cells, by adding additional resistance to the lines having the lower voltage or shorter length.

Another problem that can occur during a write operation of a cross-point magnetic memory array is leakage current through unselected cells. The leakage current occurs because the voltage drop across bit lines of unselected magnetic memory cells is different than the voltage drop across word lines of unselected magnetic memory cells. The voltage drop difference occurs because the resistance of the word lines and bit lines is different, due to a different number of cells and different aspect ratios, for example. A bit line may be wider and/or longer than a word line for example. Furthermore, the voltage potential on word line and bit line edges are different during a write operation, because of the different voltage drops across the bit lines and word lines, and because of different resistance paths from a current source to a current drain. Furthermore, the word line current may be different than the bit line current.

An embodiment of the present invention solves these problems by providing a method and structure for minimizing the voltage drop across unselected magnetic memory cells or MTJ's of a cross-point memory array, minimizing the leakage current of the word lines and bit lines of both the unselected and selected memory cells.

Figure 5:
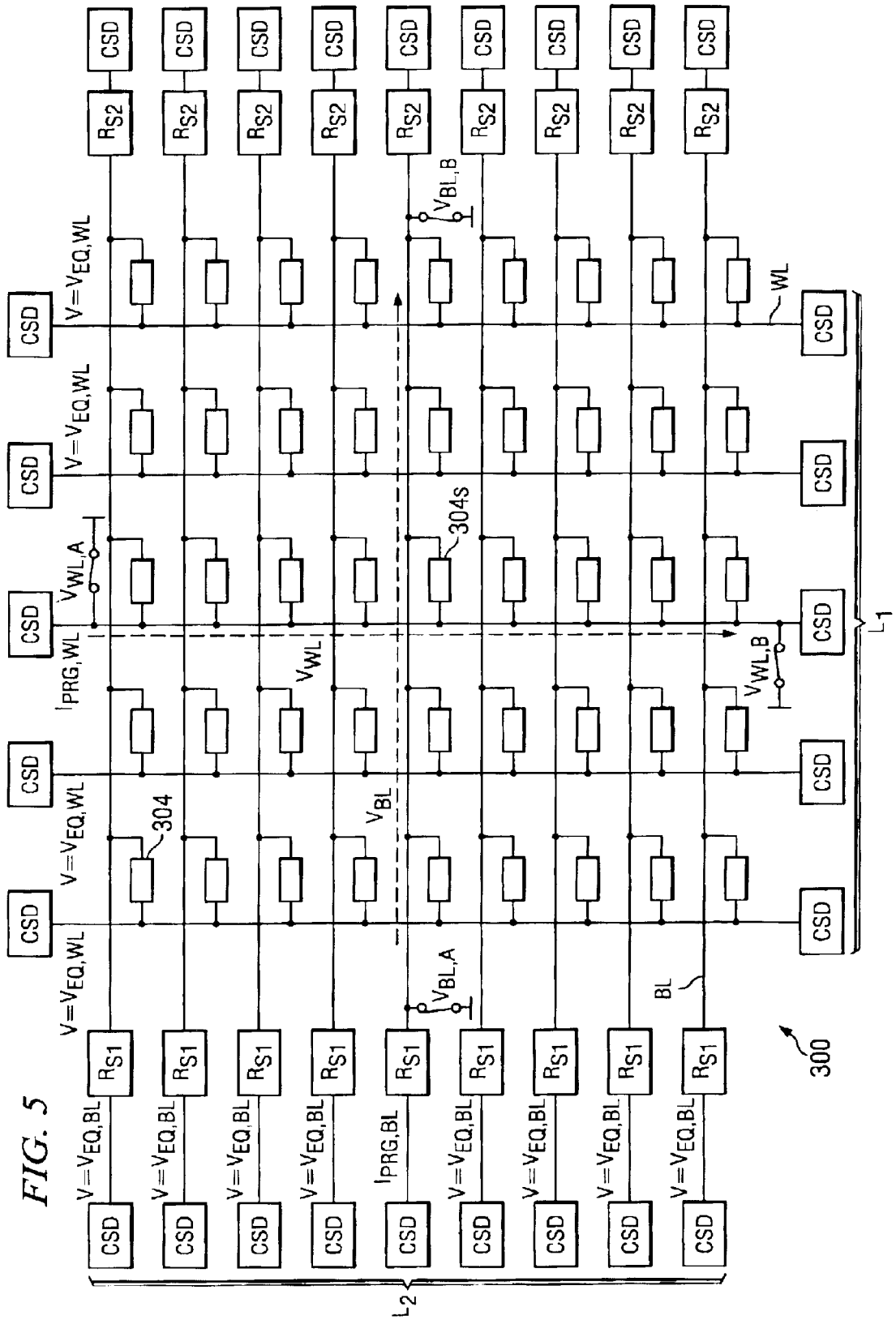
FIG. 5 shows an MRAM array in accordance with an embodiment of the invention, wherein the voltage drop across unselected MRAM cells during a write operation is minimized.

Referring now to FIG. 5, therein is shown a cross-point magnetic memory cell array 300, the array 300 including a plurality of first conductive lines WL running parallel to one another in a first direction, a plurality of second conductive lines BL running parallel to one another in a second direction, wherein the second direction is different from the first direction. A plurality of magnetic tunnel junctions (MTJ's) 304 are disposed between the first conductive lines WL and the second conductive lines BL at the intersections of the first conductive lines WL and the second conductive lines BL. At least one of the MTJ's 304 is selected to store information in, wherein the other MTJ's 304 remain unselected. Information is then stored in the selected at least one MTJ by running a first current through the first conductive line WL of the selected at least one MTJ simultaneously while running a second current BL through the second conductive line of the selected at least one MTJ, while minimizing a voltage drop across at least one of the unselected MTJ's.

A current source/drain (CSD) is coupled to an end of each first conductive line (WL) and each second conductive line (BL) as shown. Each CSD is adapted to function as a current source or a current drain and may comprise a current/voltage control (CVC) circuit, for example. Alternatively, rather coupling a CSD to each first and second conductive line, one or more CSD's may be placed proximate each edge or corner of the array 300 (not shown) and may be shared by the plurality of first and second conductive lines WL/BL, as described in U.S. patent application Ser. No. 09/885,759 filed on Jun. 20, 2001 entitled "Current Source and Drain Arrangement for Magnetoresistive Memories (MRAMs)," which application is hereby incorporated herein by reference.

The cross-point memory cell array 300 has a top edge, a bottom edge, a left edge and a right edge. Information is stored in the selected at least one MTJ by running a first current from a CSD at a first end of the first conductive line WL to a CSD at a second end of the first conductive line WL of the selected at least one MTJ, while running a second current from a CSD at a first end of the second conductive line BL to a CSD at a second end of the second conductive line BL of the selected at least one MTJ. In accordance with an embodiment of the invention, the voltage drop (V shown in FIG. 1A) across the unselected MTJ's is minimized by clamping or electrically coupling the first conductive lines WL and/or second conductive lines BL of the unselected MTJ's to a mid-point voltage $V_{EQ,\ WL}$ or $V_{EQ,\ BL}$, respectively, as shown in FIG. 5.

The mid-point voltage $V_{EQ,\ WL}$ preferably comprises the middle potential voltage of the edge voltages of the second conductive line BL of the at least one selected MTJ 304s. For example, as shown in FIG. 5, the programming current $I_{PRG,\ BL}$ is run across the second conductive line BL of the selected cell 304s. The mid-point voltage $V_{EQ,WL}$ is equal to the middle potential of a first voltage $V_{BL,A}$ of the second conductive line BL of the selected cell 304s at the left edge of the array 300 and a second voltage $V_{BL,B}$ of the BL of the selected cell 304s at the right edge of the array 300. Thus, the mid-point voltage $V_{EQ,WL}$ may be calculated using Eq. 2:

$$V_{EQ,WL}=(V_{BL,A}+V_{BL,B})/2 \qquad \text{Eq. 2}$$

Similarly, the mid-point voltage $V_{EQ,\ BL}$ preferably comprises the middle potential voltage of the edge voltages of the first conductive line WL of the at least one selected MTJ 304s. For example, the programming current $I_{PRG,\ BL}$ is run across the first conductive line WL of the selected cell 304s. The mid-point voltage $V_{EQ,BL}$ is equal to the middle potential of a third voltage $V_{WL,A}$ of the WL of the selected cell 304s at the top edge of the array 300 and a fourth voltage $V_{WL,A}$ of the WL of the selected cell 304s at the bottom edge of the array 300. Thus, the mid-point voltage $V_{EQ,BL}$ may be calculated using Eq. 3:

$$V_{EQ,BL}=(V_{WL,A}+V_{WL,B})/2 \qquad \text{Eq. 3}$$

Preferably, to eliminate parasitic currents through unselected cells 304 during the write operation, the bit line mid-point voltage is equal to the word line mid-point voltage, represented by Eq. 4:

$$V_{EQ,WL}=V_{EQ,BL} \qquad \text{Eq. 4}$$

This may be accomplished by adjusting the edge voltage $V_{WL,B}$ or $V_{BL,B}$ depending on the middle potential of the selected WL and BL. Alternatively, the edge voltage of the line with the lower middle potential may be increased to achieve the same middle potential for the word line and bit line. In this case, the voltage adjustment required may be calculated using Eq. 5:

$$V_{adj}=abs(V_{EQ,BL}-V_{EQ,WL}); \qquad \text{Eq. 5}$$

where $V_{EQ,BL}$ and $V_{EQ,WL}$ are before adjustment.

In one embodiment, if the middle potential voltage $V_{EQ,\ BL}$ of the third voltage $V_{WL,A}$ and fourth voltage $V_{WL,A}$ is lower than the middle potential voltage $V_{EQ,WL}$ of the first voltage $V_{BL,A}$ and the second voltage $V_{BL,B}$, the middle potential voltage $V_{EQ,BL}$ of the third voltage and fourth voltage is increased to be substantially equal to the middle potential voltage $V_{EQ,WL}$ of the first voltage and the second voltage.

For example, increasing the middle potential voltage $V_{EQ,BL}$ of the third voltage and fourth voltage may comprise adding a resistance $R_{S1}$ and/or $R_{S2}$ to at least one end of the second conductive BL. Resistance $R_{S1}$ may be coupled between an end of the second conductive lines BL's and the CSD's, and resistance $R_{S2}$ may be coupled between an end of the first conductive lines WL's and the CSD's, as shown. The resistances $R_{S1}$ and $R_{S2}$ preferably comprise electrical elements comprising a resistance, such as a resistor, transistor or diode, although alternatively, resistances $R_{S1}$ and $R_{S2}$ may comprise other elements, for example.

Furthermore, in one embodiment, the first conductive lines WL have a first length $L_1$ and the second conductive lines BL have a second length $L_2$, wherein the second length $L_2$ is less than the first length $L_1$. Resistance $R_{S1}$ and/or $R_{S2}$ is preferably added to at least one end of the second conductive lines BL, wherein the resistance makes the effective length of the second conductive lines BL substantially equal to the first length $L_1$ of the first conductive lines WL. Resistance $R_{S1}$ may be coupled between an end of the second conductive lines BL's and the CSD's, and resistance $R_{S2}$ may be coupled between an end of the first conductive lines WL's and the CSD's, as shown. The resistances $R_{S1}$ and $R_{S2}$ preferably comprise electrical elements comprising a resistance, such as a resistor, transistor or diode, although alternatively, resistances $R_{S1}$ and $R_{S2}$ may comprise other elements, for example.

Another embodiment of the present invention includes a cross-point magnetic memory device 300 in which the voltage drop V (FIG. 1A) is minimized across unselected MTJ's 304s, as described herein. The cross-point magnetic memory device 300 comprises an MRAM array in a preferred embodiment.

Advantages of embodiments of the present invention include providing a method and structure for storing information in a selected at least one MTJ by running a first current through the first conductive line of the selected at least one MTJ while running a second current through the second conductive line of the selected at least one MTJ and while minimizing a voltage drop across at least one of the MTJ's. The voltage drop across at least one selected MTJ, the unselected MTJ's, or both, may be minimized in accordance with embodiments of the present invention, decreasing power consumption and increasing write margin.

Minimizing the voltage drop of selected MTJ's in accordance with embodiments of the present invention is advantageous because the stress is reduced across the MTJ. Because the voltage drop is reduced or minimized, less damage to MTJ's results. The full range, e.g., all quadrants, of the asteroid curve of the MTJ is advantageously utilized in a novel way, by changing the direction of the current on both the bit lines and the word lines in a write operation.

Minimizing the voltage drop of non-selected MTJ's in accordance with embodiments is also advantageous because the leakage current through the MTJ's during the write operation is decreased, and the write margin is increased due to minimized leakage current along the selected word line and bit line. Adding resistance to the edge of the word lines or bit lines results in all unselected MTJ's being clamped to the same voltage, which means that there is no stress on the MTJ's and no parasitic currents through the unselected or selected MTJ'S.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of storing information to a magnetic memory device, the method comprising;
providing a cross-point magnetic memory cell array, the array including a plurality of first conductive lines running parallel to one another in a first direction, a plurality of second conductive lines running parallel to one another in a second direction, the second direction being different from the first direction, and a plurality of magnetic tunnel junctions (MTJ's) disposed between the first conductive lines and the second conductive lines at the intersections of the first conductive lines and the second conductive lines;
selecting at least one MTJ to store information in, wherein the other MTJ's are unselected; and
storing information in the selected at least one MTJ by running a first current through the first conductive line of the selected at least one MTJ while running a second current through the second conductive line of the selected at least one MTJ and while minimizing a voltage drop across at least one of the MTJ's,
wherein the direction of the first current and second current is selected as a function of the physical location of the at least one selected MTJ in the array.

2. The method according to claim 1, wherein minimizing the voltage drop across at least one of the MTJ's comprises minimizing the voltage drop across the at least one selected MTJ, die unselected MTJ's, or both.

3. The method according to claim 1, wherein providing the cross-point magnetic memory cell array comprises providing a magnetic random access memory (MRAM) array.

4. The method according to claim 1, wherein the cross-point memory cell array comprises a top edge, a bottom edge, a left edge and a right edge, wherein the first conductive line of the selected at least one MTJ comprises a first voltage at the left edge of the array, and wherein the first conductive line of the selected at least one MTJ comprises a second voltage at the right edge of the array, further comprising:
clamping the second conductive lines of the unselected MTJ's to a middle potential voltage of the first voltage and the second voltage, wherein the voltage drop across the unselected MTJ's is minimized.

5. The method according to claim 4, wherein the second conductive line of the selected at least one MTJ comprises a third voltage at the bottom edge of the array, and wherein the second conductive line of the selected at least one MTJ comprises a fourth voltage at the top edge of the array, further comprising:
clamping the first conductive lines of the unselected MTJ's to a middle potential voltage of the third voltage and the fourth voltage.

6. The method according to claim 5, wherein the middle potential voltage of the third voltage and fourth voltage is lower than the middle potential voltage of the first voltage and the second voltage, further comprising:
increasing the middle potential voltage of the third voltage and fourth voltage so that it is substantially equal to the middle potential voltage of the first voltage and the second voltage.

7. The method according to claim 6, wherein increasing the middle potential voltage of the third voltage and fourth voltage comprises adding resistance to at least one end of the second conductive line.

8. The method according to claim 7, wherein adding resistance comprises coupling an element to at least one end of the second conductive line.

9. The method according to claim 5, wherein the first conductive line has a first length and the second conductive line has a second length, wherein the second length is less than the first length, further comprising adding resistance to at least one end of the second conductive line, wherein the resistance makes the effective length of the second line substantially equal to the first length.

10. The method according to claim 9, wherein adding resistance comprises coupling an element to the end of the second conductive line.

11. A method of storing information to a magnetic memory device, the method comprising:
providing a cross-point magnetic memory cell array, the array including a plurality of first conductive lines running parallel to one another in a first direction, a plurality of second conductive lines running parallel to one another in a second direction, the second direction being different from the first direction, and a plurality of magnetic tunnel junctions (MTJ's) disposed between the first conductive lines and the second conductive lines at the intersections of the first conductive lines and the second conductive lines;
selecting at least one MTJ to store information in, wherein the other MTJ's are unselected; and
storing information in the selected at least one MTJ by running a first current through the first conductive line of the selected at least one MTJ while running a second current through the second conductive line of the selected at least one MTJ and while minimizing a voltage drop across at least one of the MTJ's;
wherein the cross-point memory cell array includes a current source/drain (CSD) coupled to the ends of each first conductive line and each second conductive line, each CSD being adapted to function as a current source or a current drain, wherein the first current is passed from a CSD at a first end of the first conductive line to a CSD at a second end of the first conductive line, wherein the second current is passed from a CSD at a first end of the second conductive line to a CSD at a second end of the second conductive line.

12. The method according to claim 11, wherein minimizing the voltage drop of the selected at least one MTJ comprises passing the first current from a CSD in close proximity to the selected MTJ while passing the second current from a CSD in close proximity to the selected MTJ, wherein the voltage drop across the at least one selected MTJ is minimized.

13. The method according to claim 11, wherein minimizing the voltage drop of the selected at least one MTJ comprises passing the first current from a CSD distant from the selected MTJ while passing the second current from a CSD distant from the selected MTJ, wherein the voltage drop across the at least one selected MTJ is minimized.

14. The method according to claim 11, wherein the cross-point memory cell array comprises top edge, a bottom edge, a left edge and a right edge, wherein the CSD's are located proximate the top, bottom, left and right edges, further comprising:
storing a first logic state by passing the first current from a CSD at the bottom edge of the array to a CSD at the top edge of the array, and passing the second current from a CSD at the right edge of the array to a CSD at the left edge of the array, wherein the voltage drop across the at least one selected MTJ is minimized.

15. The method according to claim 14, further comprising:
storing a second logic slate by passing the first current from a CSD at the top edge of the array to a CSD at the bottom edge of the array, and passing the second current from a CSD at the left edge of the array to a CSD at the right edge of the array, wherein the second logic state is different from the first logic state.

16. The method according to claim 14, wherein the physical location of the at least one selected MTJ is in a top left quadrant or a bottom right quadrant of the array.

17. The method according to claim 11, wherein the cross-point memory cell array comprises top edge, a bottom edge, a left edge and a right edge, wherein the CSD's are located proximate the top, bottom, left and right edges, further comprising:
storing a first logic state by passing the first current from a CSD at the top edge of the array to a CSD at the bottom edge of the array, and passing the second current from a CSD at the right edge of the array to a CSD at the left edge of the array, wherein the voltage drop across the at least one selected MTJ is minimized.

18. The method according to claim 17, further comprising:
storing a second logic state by passing the first current from a CSD at the bottom edge of the array to a CSD at the top edge of the array, and passing the second current from a CSD at the left edge of the array to a CSD at the right edge of the array, wherein the second logic state is different from the first logic state.

19. The method according to claim 17, wherein the physical location of the at least one selected MTJ is in a bottom left quadrant or a top right quadrant of the array.

20. A cross-point magnetic memory device, comprising:
a cross-point magnetic memory cell array, the array including a plurality of first conductive lines running parallel to one another in a first direction, a plurality of second conductive lines running parallel to one another in a second direction, the second direction being different from the first direction, a plurality of magnetic tunnel junctions (MTJ's) disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's;
wherein the cross-point memory cell array includes a current source/drain (CSD) coupled to an end of each first conductive line and each second conductive line, wherein the first current is passed from a CSD at a first end of the first conductive line to a CSD at a second end of the first conductive line, wherein the second current is passed from a CSD at a first end of the second conductive line to a CSD at a second end of the second conductive line, each CSD being adapted to function as a current source or a current drain.

21. The cross-point magnetic memory device according to claim 20, wherein the minimized voltage drop is across the at least one selected MTJ, the unselected MTJ's, or both.

22. The cross-point magnetic memory device according to claim 20, wherein the cross-point magnetic memory cell array comprises a magnetic random access memory (MRAM) array.

23. A cross-point magnetic memory device comprising:
a cross-point magnetic memory cell array, the array including a plurality of first conductive lines running parallel to one another in a first direction, a plurality of second conductive lines running parallel to one another in a second direction, the second direction being different from the first direction, a plurality of magnetic tunnel junctions (MTJ's) disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's;
wherein information is stored by passing the first current from a CSD in close proximity to the selected MTJ while passing the second current from a CSD in close proximity to the selected MTJ, wherein the voltage drop across the selected MTJ is minimized.

24. A cross-point magnetic memory device comprising:
a cross-point magnetic memory cell array, the array including a plurality of first conductive lines running parallel to one another in a first direction, a plurality of second conductive lines running parallel to one another in a second direction, the second direction being different from the first direction, a plurality of magnetic tunnel junctions (MTJ's) disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's;
wherein information is stored by passing the first current from a CSD distant from the selected MTJ while passing the second current from a CSD distant from the selected MTJ, wherein the voltage drop across the at least one selected MTJ is minimized.

25. A cross-point magnetic memory device comprising:
a cross-point magnetic memory cell array, the array including a plurality of first conductive lines running parallel to one another in a first direction, a plurality of second conductive lines running parallel to one another in a second direction, the second direction being different from the first direction, a plurality of magnetic tunnel junctions (MTJ's) disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's;

wherein the cross-point memory cell array comprises a top edge, a bottom edge, a left edge and a right edge, wherein the CSD's are located proximate the top, bottom, left and right edges, wherein a first logic state is storable in the at least one selected MTJ by passing the first current from a CSD at the bottom edge of the array to a CSD at the top edge of the array, and passing the second current from a CSD at the right edge of the array to a CSD at the left edge of the array, wherein the voltage drop across the at least one selected MTJ is minimized.

26. The cross-point magnetic memory device according to claim 25, wherein a second logic state is storable in the at least one selected MTJ by passing the first current from a CSD at the top edge of the array to a CSD at the bottom edge of the array, and passing the second current from a CSD at the left edge of the array to a CSD at the right edge of the array, wherein the second logic state is different from the first logic state.

27. The cross-point magnetic memory device according to claim 25, wherein the physical location of the at least one selected MTJ is in a top left quadrant or a bottom right quadrant of the array.

28. A cross-point magnetic memory device comprising:
a cross-point magnetic memory cell array, the array including a plurality of first conductive lines running parallel to one another in a first direction, a plurality of second conductive lines running parallel to one another in a second direction, the second direction being different from the first direction, a plurality of magnetic tunnel junctions (MTJ's) disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's;

wherein the cross-point memory cell array comprises a top edge, a bottom edge, a left edge and a right edge, wherein the CSD's are located proximate the top, bottom, left and right edges, wherein a first logic state is storable in the at least one selected MTJ by passing the first current from a CSD at the top edge of the array to a CSD at the bottom edge of the array, and passing the second current from a CSD at the right edge of the array to a CSD at the left edge of the array, wherein the voltage drop across the at least one selected MTJ is minimized.

29. The cross-point magnetic memory device according to claim 28, wherein a second logic state is storable in the at least one selected MTJ by passing the first current from a CSD at the bottom edge of the array to a CSD at the top edge of the array, and passing the second current from a CSD at the left edge of the array to a CSD at the right edge of the array, wherein the second logic state is different from the first logic state.

30. The cross-point magnetic memory device according to claim 28, wherein the physical location of the at least one selected MTJ is in a bottom left quadrant or a top right quadrant of the array.

31. A cross-point magnetic memory device comprising:
a cross-point magnetic memory cell array, the array including a plurality of first conductive lines running parallel to one another in a first direction, a plurality of second conductive lines running parallel to one another in a second direction, the second direction being different from the first direction, a plurality of magnetic tunnel junctions (MTJ's) disposed between the first conductive lines and the second conductive lines at the intersections of the first conductive lines and the second conductive lines, wherein information is storable in a selected at least one MTJ by running a first current through the first conductive line of the selected at least one MTJ while running a second current through the second conductive line of the selected at least one MTJ, wherein the magnetic memory device comprises a minimized voltage drop across at least one of the MTJ's;

wherein the cross-point memory cell array comprises a top edge, a bottom edge, a left edge and a right edge, wherein the first conductive line of the selected at least one MTJ comprises a first voltage at the left edge of the array, and wherein the first conductive line of the selected at least one MTJ comprises a second voltage at the right edge of the array, wherein the second conductive lines of the unselected MTJ's are clamped to a middle potential voltage of the first voltage and the second voltage, wherein the voltage drop across the unselected MTJ's is minimized.

32. The cross-point magnetic memory device according to claim 31, wherein the second conductive line of the selected at least one MTJ comprises a third voltage at the bottom edge of the array, and wherein the second conductive line of the selected at least one MTJ comprises a fourth voltage at the top edge of the array, wherein the first conductive lines of the unselected MTJ's are clamped to a middle potential voltage of the third voltage and the fourth voltage.

33. The cross-point magnetic memory device according to claim 32, wherein the middle potential voltage of the third voltage and fourth voltage is lower than the middle potential voltage of the first voltage and the second voltage, wherein the middle potential voltage of the third voltage and fourth voltage are increased so that it is substantially equal to the middle potential voltage of the first voltage and the second voltage.

34. The cross-point magnetic memory device according to claim 33, further comprising an element having resistance coupled to an end of the second conductive line to increase the middle potential voltage of the third voltage and fourth voltage.

35. The cross-point magnetic memory device according to claim 32, wherein the first conductive line has a first length and the second conductive line has a second length, wherein the second length is less than the first length, further comprising a resistive element coupled to an end of the second conductive line, wherein the resistive element makes the effective length of the second line substantially equal to the first length.

36. A method of minimizing a voltage drop across at least one selected magnetic tunnel junction (MTJ) during a write operation in a cross-point magnetic memory cell array including a plurality of first conductive lines running parallel to one another in a first direction, a plurality of second conductive lines running parallel to one another in a second direction, the second direction being different from the first direction, and a plurality of MTJ's being disposed between the first conductive lines and the second conductive lines at the intersections of the first conductive lines and the second conductive lines, a current source/drain (CSD) being coupled to an end of each first conductive line and each second conductive line, each CSD being adapted to function as a current source or a current drain, the method comprising:

storing information in the selected at least one MTJ by running a first current from a CSD at a first end of the first conductive line to a CSD at a second end of the first conductive line of the selected at least one MTJ while running a second current from a CSD at a first end of the second conductive line to a CSD at a second end of the second conductive line of the selected at least one MTJ, wherein the direction of the first current and second current is selected as a function of the physical location of the at least one selected MTJ in the array to minimize the voltage drop of the at least one selected MTJ.

37. The method according to claim 36, wherein minimizing the voltage drop of the selected at least one MTJ comprises passing the first current from a CSD in close proximity to the selected MTJ while passing the second current from a CSD in close proximity to the selected MTJ.

38. The method according to claim 36, wherein minimizing the voltage drop of the selected at least one MTJ comprises passing the first current from a CSD distant from the selected MTJ while passing the second current from a CSD distant from the selected MTJ.

39. The method according to claim 36, wherein the cross-point memory cell array comprises a top edge, a bottom edge, a left edge and a right edge, wherein the CSD's are located proximate the top, bottom, left and right edges of the array, further comprising:
storing a first logic state by passing the first current from a CSD at the bottom edge of the array to a CSD at the top edge of the array, and passing the second current from a CSD at the right edge of the array to a CSD at the left edge of the array; and
storing a second logic state by passing the first current from a CSD at the top edge of the array to a CSD at the bottom edge of the array, and passing the second current from a CSD at the left edge of the array to a CSD at the right edge of the array, wherein the second logic state is different from the first logic state.

40. The method according to claim 39, wherein the physical location of the at least one selected MTJ is in a top left quadrant or a bottom right quadrant of the array.

41. The method according to claim 36, wherein the cross-point memory cell array comprises top edge, a bottom edge, a left edge and a right edge, wherein the CSD's are located proximate the top, bottom, left and right edges, further comprising:
storing a first logic stale by passing the first current from a CSD at the top edge of the array to a CSD at the bottom edge of the array, and passing the second current from a CSD at the right edge of the array to a CSD at the left edge of the array; and
storing a second logic state by passing the first current from a CSD at the bottom edge of the array to a CSD at the top edge of the array, and passing the second current from a CSD at the left edge of the array to a CSD at the right edge of the array, wherein the second logic state is different from the first logic state.

42. The method according to claim 41, wherein the physical location of the at least one selected MTJ is in a bottom left quadrant or a top right quadrant of the array.

43. The method according to claim 36, wherein information is stored to more than one MTJ in two separate write operations, depending on the location of the selected MTJ's.

44. A method of minimizing a voltage drop across unselected magnetic tunnel junctions (MTJ's) during a write operation of at least one selected MTJ in a cross-point magnetic memory cell array including a plurality of first conductive lines running parallel to one another in a first direction, a plurality of second conductive lines running parallel to one another in a second direction, the second direction being different from the first direction, and a plurality of MTJ's being disposed between the first conductive lines and the second conductive lines at the intersections of the first conductive lines and the second conductive lines, a current source/drain (CSD) being coupled to an end of each first conductive line and each second conductive line, each CSD being adapted to function as a current source or a current drain, the cross-point memory cell array having a tap edge, a bottom edge, a left edge and a right edge, the method comprising:
storing information in the selected at least one MTJ by running a first current from a CSD at a first end of the first conductive line to a CSD at a second end of the first conductive line of the selected at least one MTJ while running a second current from a CSD at a first end of the second conductive line to a CSD at a second end of the second conductive line of the selected at least one MTJ, wherein the voltage drop across the unselected magnetic tunnel junctions is minimized by clamping the first conductive lines or second conductive lines of the unselected MTJ's to a mid-point voltage.

45. The method according to claim 44, wherein the first conductive line of the at least one selected MTJ comprises a first voltage at the left edge of the array, and wherein the first conductive line of the at least one selected MTJ comprises a second voltage at the right edge of the array, wherein clamping the second conductive lines to a mid-point voltage comprises clamping the second conductive lines of the unselected MTJ's to a middle potential voltage of the first voltage and the second voltage.

46. The method according to claims 45, wherein the second conductive line of the selected at least one MTJ comprises a third voltage at the bottom edge of the array, and wherein the second conductive line of the selected at least one MTJ comprises a fourth voltage at the top edge of the array, wherein clamping the first conductive lines to a mid-point voltage comprises clamping the first conductive lines of the unselected MTJ's to a middle potential voltage of the third voltage and the fourth voltage.

47. The method according to claim 46, wherein the middle potential voltage of the third voltage and fourth voltage is lower than the middle potential voltage of the first voltage and the second voltage, further comprising:
increasing the middle potential voltage of the third voltage and fourth voltage to be substantially equal to the middle potential voltage of the first voltage and the second voltage.

48. The method according to claim 47, wherein increasing the middle potential voltage of the third voltage and fourth voltage comprises adding resistance to an end of the second conductive line.

49. The method according to claim 48, wherein adding resistance comprises coupling an element to the end of the second conductive line.

50. The method according to claim 46, wherein the first conductive line has a first length and the second conductive line has a second length, wherein the second length is less than the first length, further comprising adding resistance to an end of the second conductive line, wherein the resistance makes the effective length of the second conductive line substantially equal to the first length.

51. The method according to claim 50, wherein adding resistance comprises coupling an element to an end of the second conductive line.

* * * * *

UNITED STATES PATENT AND TRADEMARK OFFICE
CERTIFICATE OF CORRECTION

PATENT NO. : 6,930,915 B2
DATED : August 16, 2005
INVENTOR(S) : Lammers et al.

It is certified that error appears in the above-identified patent and that said Letters Patent is hereby corrected as shown below:

Column 1,
Line 14, delete "(MJT)" insert -- (MTJ) --.

Column 2,
Line 12, delete "(MJT)" insert -- (MTJ) --.
Line 46, delete "MTJ'S" insert -- MTJ's --.

Column 13,
Line 51, delete "die" insert -- the --.

Column 15,
Line 17, delete "slate" insert -- state --.

Column 19,
Line 45, delete "stale" insert -- state --.

Column 20,
Line 11, delete "tap" insert -- top --.

Signed and Sealed this

Twenty-eighth Day of February, 2006

JON W. DUDAS
*Director of the United States Patent and Trademark Office*